United States Patent [19]
Raza

[11] Patent Number: 5,926,035
[45] Date of Patent: Jul. 20, 1999

[54] METHOD AND APPARATUS TO GENERATE MASK PROGRAMMABLE DEVICE

[75] Inventor: S. Babar Raza, Sunnyvale, Calif.

[73] Assignee: Cypress Semiconductor Corp., San Jose, Calif.

[21] Appl. No.: 08/669,715

[22] Filed: Jun. 26, 1996

[51] Int. Cl.⁶ .................. H03K 19/173; H03K 19/177
[52] U.S. Cl. ............................................. 326/38; 326/41
[58] Field of Search ................................. 326/38, 39, 41

[56] References Cited

U.S. PATENT DOCUMENTS

| | | | |
|---|---|---|---|
| 4,240,094 | 12/1980 | Mader | 357/45 |
| 4,600,846 | 7/1986 | Burrows | 326/39 |
| 4,771,285 | 9/1988 | Agrawal et al. | 326/38 |
| 4,866,432 | 9/1989 | Goetting | 326/38 |
| 4,931,946 | 6/1990 | Ravindra et al. | 364/490 |
| 4,990,489 | 2/1991 | Mashiko et al. | 395/94 |
| 5,068,603 | 11/1991 | Mahoney | 324/158 |
| 5,105,388 | 4/1992 | Itano et al. | 326/44 |
| 5,128,871 | 7/1992 | Schmitz | 364/490 |
| 5,157,618 | 10/1992 | Ravindra et al. | 364/490 |
| 5,289,406 | 2/1994 | Uramoto et al. | 365/94 |
| 5,341,041 | 8/1994 | El Gamal | 326/39 |
| 5,394,103 | 2/1995 | Cooke et al. | 326/38 |
| 5,513,124 | 4/1996 | Trimberger et al. | 364/491 |
| 5,517,061 | 5/1996 | Azmanov | 365/94 |
| 5,521,837 | 5/1996 | Frankie et al. | 364/491 |
| 5,526,278 | 6/1996 | Powell | 364/489 |
| 5,550,839 | 8/1996 | Buch et al. | 371/22.1 |
| 5,635,855 | 6/1997 | Tang | 326/38 |
| 5,636,368 | 6/1997 | Harrison et al. | 395/500 |

OTHER PUBLICATIONS

Wakerly, John F., "Digital Design Principles and Practices", copyright 1989 by John F Wakerly, pp. 214–217, 1989.

*Primary Examiner*—Michael Tokar
*Assistant Examiner*—Richard Roseen
*Attorney, Agent, or Firm*—Maiorana & Acosta, P.C.

[57] ABSTRACT

The present invention concerns a mask-programmed cell comprising an input, an output and a transistor. The transistor has a first terminal and a second terminal. The cell may be configured in a first of three possible states when (a) the cell input is coupled to the first terminal via a first of two mask-programmed interconnects, and (b) the second terminal is coupled to the output. The cell may be configured in a second of three possible states when (a) a complement of the cell input is coupled to the first terminal via a second of the two mask-programmed interconnects, and (b) the second terminal is coupled to the output. The cell may be configured in a third of the three possible states when either the second terminal or the output is coupled to a predetermined level signal.

21 Claims, 14 Drawing Sheets

METHOD AND APPARATUS TO GENERATE MASK PROGRAMMABLE DEVICE

The present application may be related to U.S. application Ser. No. 08/669,713, filed concurrently, incorporated herein by reference in its entirety.

FIELD OF THE INVENTION

The present invention relates to the field of logic devices; more particularly, the present invention relates to programmable logic devices.

BACKGROUND OF THE INVENTION

In many applications, using general purpose, commercially available logic devices in a circuit may provide a suboptimum result. Commercially available, general purpose chips have a standard number and location of logic gates to which a circuit design must conform to if standard chips (integrated circuits) are used. Such integrated circuits (ICs) often include additional gates that may not be used, may use power, occupy space, and generate heat, at the expense of performance. The chip logic can not be altered to fit the custom logic.

Custom chips can provide an alternative to commercially available, general purpose chips. ASICs (Application Specific Integrated Circuits) are a form of custom ICs which are usually specifically designed for particular application. However, custom chips are expensive and difficult to manufacture in small quantities, and often require greater time to manufacture. ASICs may be completely custom or may be created from a pre-existing core design which is personalized with "personalization layers." A personalization layer is typically an interconnect layer which may be selectively applied to interconnect circuits in an underlying core logic or an IC. In this situation, the personalization layer "programs" the core logic for a particular function, but if there is a "bug" or error in the design, the IC must be fabricated again, with a modification in the personalization layer or the underlying core logic in order to correct the error. Redesigning and fabricating such an IC is considerably more expensive, at least for small volume parts, than re-programming a general purpose field programmable device. Thus, in many applications, commercially available, general purpose field programmable devices are preferred over custom chips such as ASICs because of the re-programmability of such programmable devices.

Programmable logic devices (PLDs) which include a programmable logic array (PLA) are examples of commercially available, general purpose ICs which provide customization. Programmable logic devices may include a set of input lines and a set of AND-OR or NOR—NOR logic arrays, with transistors coupling the inputs to the logic arrays. Such devices often implement Boolean functions as sum-of-products, or SOP, equations. Programmable Logic Devices (PLDs) allow a user to connect various device inputs to the AND-gate inputs, or any of a number of AND-gate outputs to any of a number of OR-gate inputs. Such connections are accomplished by programming or not programming signal paths, by connecting or disconnecting preexisting data paths. Programming may be accomplished by, for example, fusing or antifusing.

Many commercially available PLDs provide auxiliary circuitry for testing and programming. Although necessary in many available PLD's, the auxiliary test and programming circuitry carries a high cost in die area.

Therefore, it is desirable to have a device that occupies smaller die area. This may be accomplished by reducing and/or eliminating programming and/or testing circuitry in the device. It is also desirable to have a method of producing such a device that uses a cheaper or simpler process. Such a method may result in better yields, because of the simpler process.

CPLD's (complex PLD's) have an advantage in their predictability of timing that may be essential for time-critical designs. However, CPLD's may be relatively expensive to produce, thus it is desirable to have a cheaper alternative to CPLD's without the overhead associated with CPLD manufacture.

The devices in a logic array typically include programmable devices (e.g. $E^2$PROM, EPROM, fuses, antifuses, flash memory devices) which allow the logic arrays to be programmable (or re programmable). The input lines and the logic arrays are also typically interconnected programmably by similar programmable devices.

It is also desirable to have mask programmable chips that may be faster and may consume less power than fully programmable PLDs and yet are derived from programmable PLD's such that redesign of the mask programmable device merely involves re-programming of the programmable device to derive the mask for the mask programmable device.

The present invention, which allows reprogramming and testing of a FLPD by a user or customer, concerns a method of quickly and efficiently producing a mask programmed PLD having many advantages (e.g. smaller size and cheaper process) over methods of producing FPLDs, while having the capability of meeting the particular needs of the user, and ensuring predictability of timing and correctness of design.

SUMMARY OF THE INVENTION

The present invention concerns a mask-programmed cell which includes a cell and at least two closeable interconnects thereto, at least one of which is mask-programmed.

The present invention also concerns a mask-programmed logic device (MPLD) having one or more mask-programmed cells. In several embodiments, the mask-programmed logic device comprises either an AND-plane or a NOR-plane that receives input signals and implements a logic function, selectively providing signal paths from the input signals to other circuitry in the device. Selectivity may also or alternatively be provided in an OR-plane or second NOR-plane. In some embodiments, the signal paths are selectively provided by a plurality of programmed cells, each programmed cell having a cell input and a conductor having an open conductor region, the conductor providing an input signal to the cell input if the open conductor region is closed. Each mask-programmed logic device also has a mask programmed interconnect for selectively closing said open conductor region such that the cell input is coupled to the input signal through the mask programmed interconnect. In several embodiments, the mask programmed interconnect is derived from a field programmable logic device.

In some embodiments of the present invention, a mask-programmed macrocell is presented. The mask-programmed macrocell comprises a sequential circuit and a combinational logic circuit, each having an input interconnectible to the input signal via mask-programmed interconnections. Some of the macrocell embodiments of the present invention also include clocked devices and inverters, that may be interconnected via mask-programmed interconnections.

In some embodiments of the present invention, a mask-programmed product term matrix (PTM) is presented that comprises cells as set forth above, having cell inputs and conductors each having an open conductor region, the conductor providing an input signal to said cell input if said open conductor region is closed, each cell also having a mask programmed interconnect for selectively closing said open conductor region such that said cell input is coupled to said input signal through said mask programmed interconnect, wherein said mask programmed interconnect is derived from a field programmable logic device.

Other embodiments include a mask-programmed gate array, similarly comprising programmed or programmable cells similar to those described above with reference to the MPLD.

BRIEF DESCRIPTION OF THE DRAWINGS

The present invention will be understood more fully from the detailed description given below and from the accompanying drawings of various embodiments of the invention, which, should not be taken to limit the invention to the specific embodiments, but are for illustrative, and explanative purposes and to aid the reader in gaining a better understanding of the invention.

DETAILED DESCRIPTION OF THE PRESENT INVENTION

A mask programmable device is described. In the following description, numerous details are set forth, such as distances between components, types of materials, etc. It will be apparent, however, to one skilled in the art, that the present invention may be practiced other than as specifically described herein. In other instances, well-known structures and devices are shown in block diagram form, rather than in detail, to minimize obscuring the present invention.

Smaller die size, better yields, and a cheaper process for high volume designs may be achievable, reducing cost. This allows taking advantage of other technologies presently available as well as providing an opportunity to incorporate other technologies currently in development at no additional cost. The present invention provides for programmed logic devices that are faster than full custom CPLD's and faster than FPLAs, and that operate at lower power than full custom CPLDs. The present invention also includes embodiments that can be used to replace competitor's parts, and that can reduce overhead for parts derived from the same base design.

Figure 1:
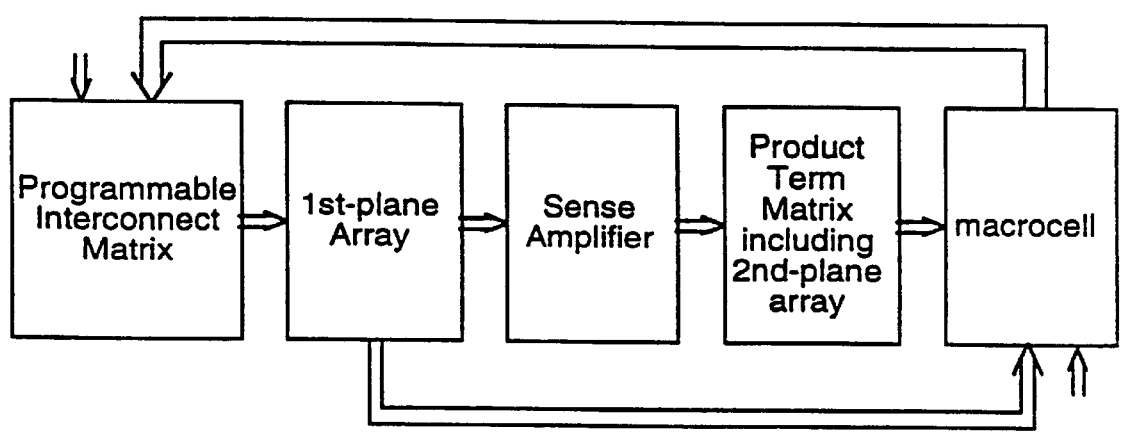
FIG. 1 shows one embodiment of a programmable logic device.

Referring to FIG. 1, a top level representation of one embodiment of a programmed device is shown. External inputs and feedback inputs are provided to a programmable interconnect matrix (PIM). The PIM, in one embodiment, comprises several PIM blocks, each block receiving a subset of the external and/or feedback inputs to the PIM, each PIM block providing a signal to the PIM output. The PIM output signals are provided to a first plane array. The first plane array may be configured as an AND-array or a NOR-array, or any other configuration implementing a logic function. In one embodiment, the first plane array comprises programmed interconnects that selectively connect particular PIM output signals to output signals of the first plane array such that the output of the first plane is equivalent to an AND-gate output whose inputs are a subset of the PIM output signals. As stated above, the first plane may be selectively configured or programmed, and may be implemented as either an AND-plane or a NOR-plane.

The output of the first plane array is provided to sense amplifiers that respond quickly to signals received at the sense amplifier inputs. Generally, sense amplifiers respond to signals on one or more bit lines; in several embodiments of the present invention, the sense amplifiers respond to signals received via bit lines from the outputs of the first plane array.

The sense amplifiers provide signals to a product term matrix (PTM) that may comprise a second plane array. The second plane array may be configured as an OR-plane or a NOR-plane, or other configuration implementing a logic function; the particular implementation generally provides broad functional flexibility in coordination with the first plane array. When the first plane is an AND-array, the second plane is generally configured as an OR-array; when the first plane is configured as a NOR-array, the second plane is generally configured as a NOR-array.

The second plane, like the first plane, may be programmable or programmed by the interconnections between input lines and output lines. As will be described below, in some embodiments of the present invention interconnection in either or both planes may be accomplished by mask programmable or mask programmed interconnects, or via mask programmable or mask programmed cells.

The product term matrix provides a number of signals to a macrocell that may also receive external inputs. The macrocell may be any of a number of configurations or designs, some of which may be in accordance with the present invention. The macrocell may contain storage, sequential, clocked or registered circuits as well as combinational (combinatorial) circuits.

In one embodiment of the present invention, the macrocell may be mask programmed or mask programmable, as will be explained further.

The macrocell provides a plurality of outputs that in some embodiments are provided as feedback inputs to the PIM. Through the PIM, these macrocell outputs may be available to the bit plane array. In some embodiments, the macrocell is bi-directional, having input/output connections that may receive as well as provide signals. To control the macrocell configuration, control signals may be provided to the macrocell, either externally or from another component of the programmed device. The control signals may include clock-control for clocked circuits within the macrocell.

Figure 2:
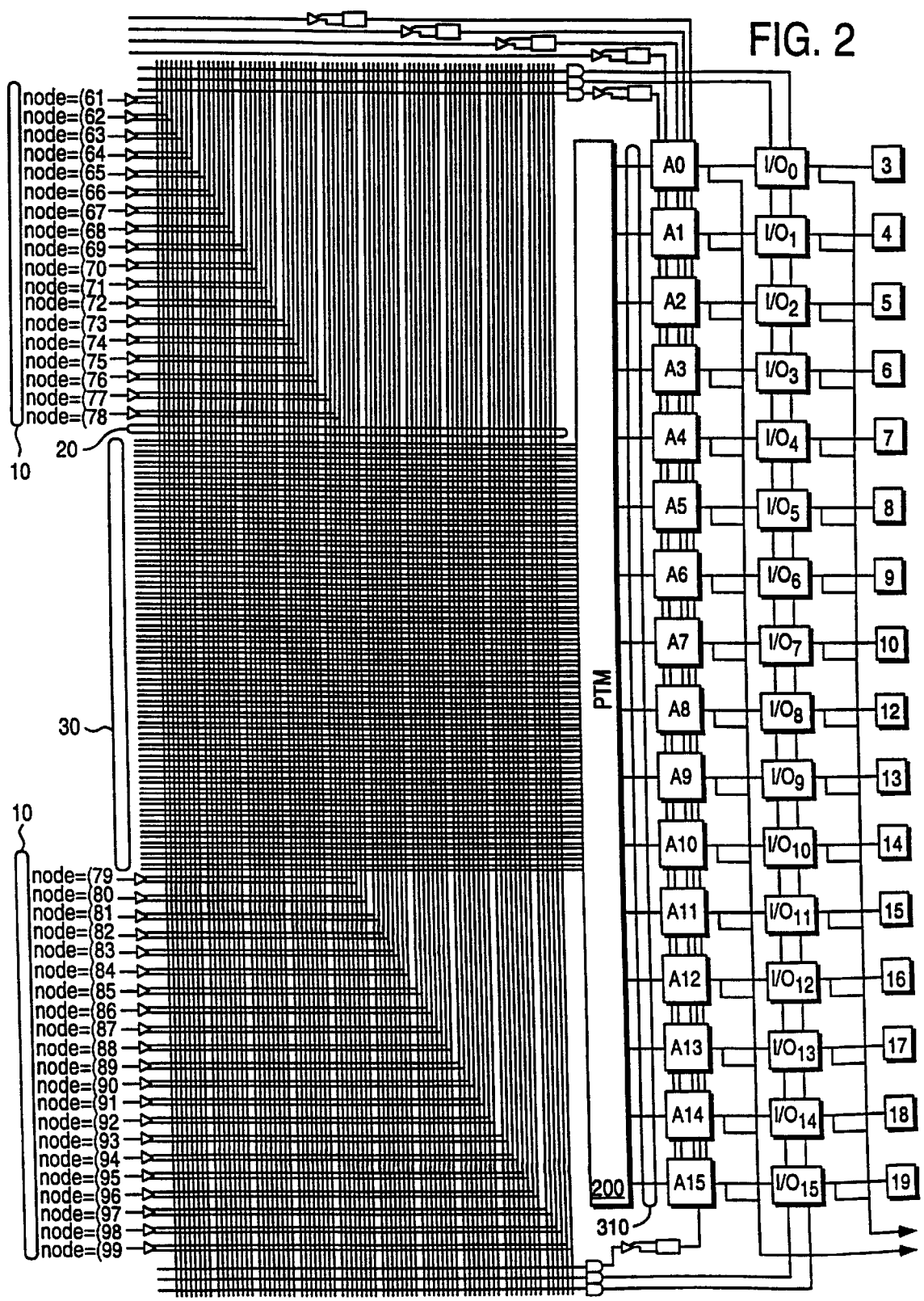
FIG. 2 compares the present programmable logic device and a conventional PLD.
Figure 3:
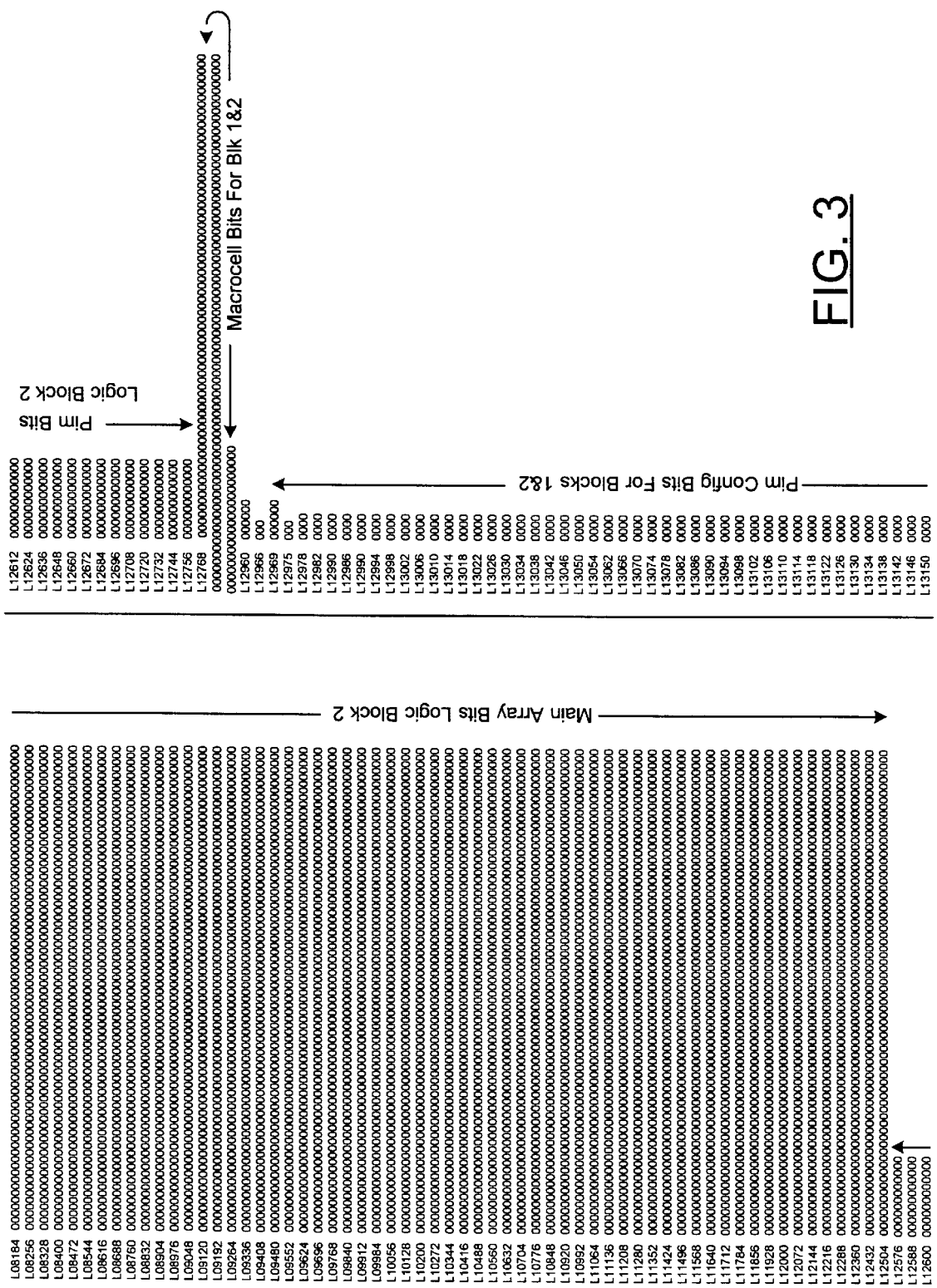
FIG. 3 shows an example of jedec map as used in one embodiment of the present invention.

Referring now to FIG. 2, a plurality of true input signals 10 is received at a programmable array logic device. Each of the true input signals is provided to an inverter, producing an inverted signal. The true and inverted signals are individually provided to separate internal bit lines 20 within the first plane of the device. Although true and inverted signals are described in the embodiment of the present invention shown in FIG. 1, it will be apparent to one of ordinary skill in the art that individual independent signals, without inversion, may be used instead. The first plane of the programmable array logic device may be the AND plane in an AND-OR configuration, or the first NOR plane in a NOR—NOR configuration. The first plane may be programmed or left unprogrammed to implement a plurality of logic functions. Such programming or non-programming is accomplished by selectively providing mask-programmed interconnection between individual internal bit lines 20 and PTM input signals 30, according to the logic functions such that PTM inputs 30 are the outputs of the logic functions. The PTM input signals 30 are provided to a PTM 200. The PTM contains circuitry that provides functionality of a second plane in the programmable array logic, either the OR plane of and AND-OR configuration, or else the second NOR plane of a NOR—NOR configuration. Like the first plane, the second plane may also or alternatively be programmed to implement a plurality of logic functions, by selectively providing mask programmed interconnections. The PTM provides a plurality of signals 310 to a macro-cell 300, which will be explained below. Control circuitry 40 is provided, controlling the synchronization and selectivity of the macro-cell.

A jedec map of a programmable interconnect matrix is shown below. Jedec maps similar to the jedec map shown below are conventional and are used in conventional FPLD's. A jedec map, produced by programming software within a computer system (not shown), indicates how to implement the logic function in terms of a FPLD. Each horizontal line shown in the jedec map below represents a minterm that is formed of the Boolean product of input signals. It will be understood that programming software may be used to produce an LOF-file that also indicates how to implement the logic function in FPGAs.

The programming software of the present invention may be conveniently implemented using a conventional general purpose digital computer programmed according to the teachings of the present specification, as will be apparent to those skilled in the relevant art(s). Appropriate software coding can readily be prepared by skilled programmers based on the teachings of the present disclosure, as will be apparent to those skilled in the relevant art(s).

The present invention may also be implemented by the preparation of application specific integrated circuits or by interconnecting an appropriate network of conventional component circuits as described herein, modifications of which will be readily apparent to those skilled in the relevant art(s).

The present invention thus also includes a computer program product which may comprise a storage medium including instructions which can be used to program a computer to perform a process according to the present invention. The storage medium can include, but is not limited to, any type of disk including floppy disks, optical disks, CD-ROMs, and magneto-optical disks, ROMs, RAMs, EPROMs, EEPROMs, magnet or optical cards, or any type of media suitable for storing electronic instructions.

Figure 4:
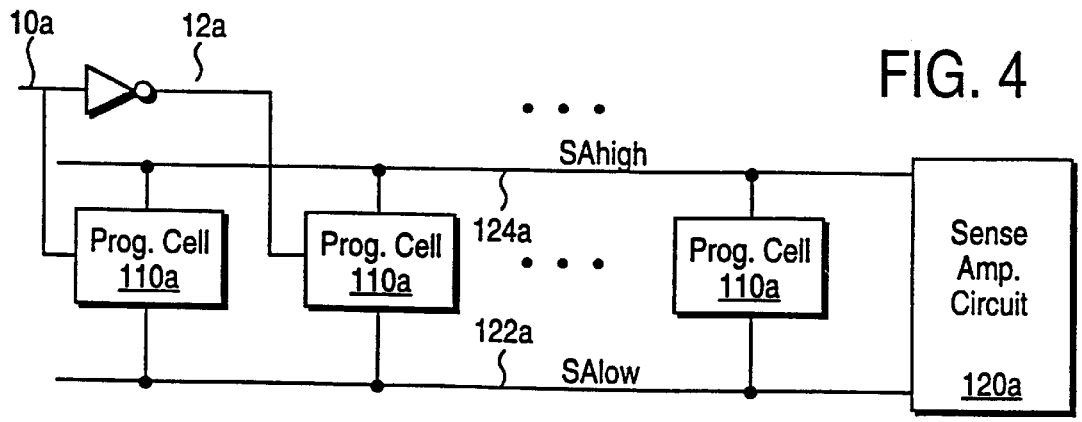
FIG. 4 shows one embodiment of a row of programmable cells in a product term.

Referring now to FIG. 4, in one embodiment a product term row of programmable flash cells according to the previous method is shown. An input signal 10a is received and inverted by an inverter to produce an inverted signal 12a, and the true and inverted signals are provided to independently programmable cells 110a. A pair of bit lines 122a and 124a provide a signal to a sense amplifier circuit 120a. If a programmable cell 110a is programmed, then the cell to which the input is connected is part of the logic function; but if the cell is not programmed then SAhigh 124a and SAlow 122a are either connected or disconnected according to either the input signal 10a (or the complement thereof 12a) that is received by the cell 110a. If the cell 110a is not programmed, the connection of SAhigh 124a and SAlow 122a depends on the input signal 10a. By programming the programmable cells 110a, an implementer can select or deselect signals to be provided to the sense amplifier circuit 120a.

Figure 5:
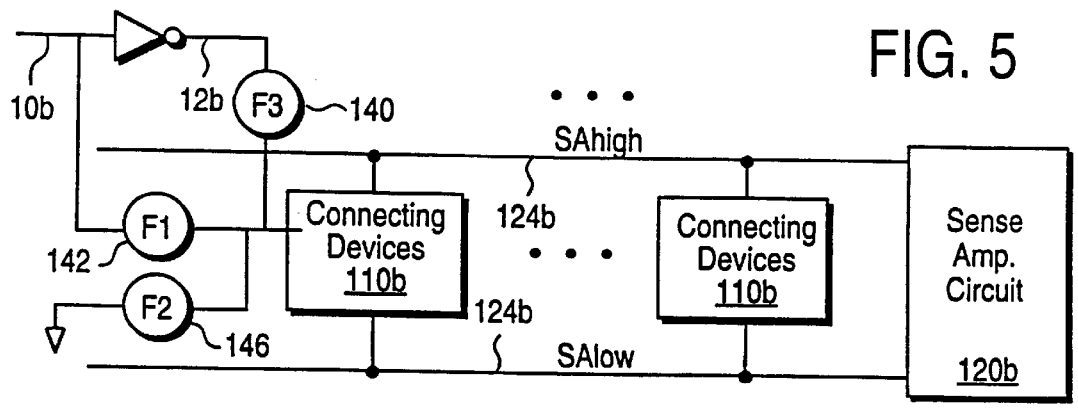
FIG. 5 shows one embodiment of an improved circuit for a row of connecting devices according to an embodiment of the present invention.

Referring now to FIG. 5, an improved product term array circuit or AND-plane array interconnect circuit according to one embodiment of the present invention is shown. The connecting device 110b may receive either an input signal 10b, an inverted signal 12b, or be grounded, according to how links 140, 142, and 146 are selected. Links 140, 142, and 146 may independently be configured as either fuses, antifuses, or mask-programmed interconnects, and are preferably configured so that only one link provides a connection to the input of the connecting device 110b. As is shown in FIG. 5, the number of connecting devices 110b that are required to implement the array circuit is advantageously reduced by fifty percent, since the input signal 10b and the inverted signal 12b do not require separate connecting devices 110b. Connecting devices 110b that are not required to implement the logic function are simply grounded by link 146.

Figure 6:
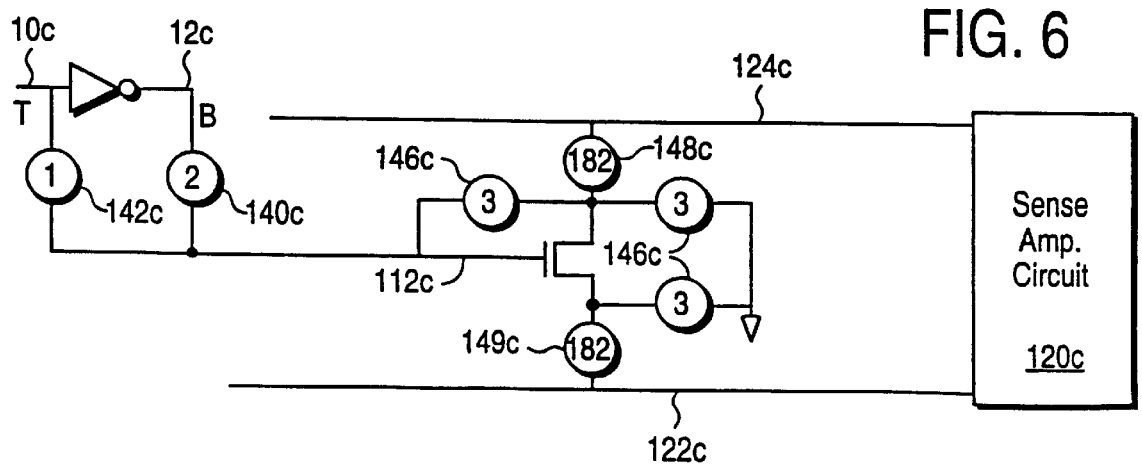
FIG. 6 shows an alternate embodiment of a row of connecting devices in a product term according to the present invention.

Referring now to FIG. 6, an alternate embodiment of the programmable product term array or AND-plane array interconnect circuit according to another embodiment of the present invention is shown. A received input signal 10c and the inverted complement thereof 12c are each independently coupled to the gating terminal of a transistor 112c through links 142c and 140c, respectively. The other terminals of the transistor 112c are each connected to ground by three links 146c. A link 148c connects one non-gating terminal of the transistor 112c to a first sense amplifier bit line 124c, while a second link 149c couples the other non-gating transistor terminal to the other sense amplifier bit line 122c. In this configuration, a connection across link 142c, 148c and 149c allows the received input signal 10c to open or close the transistor 112c, selectively connecting or disconnecting the sense amplifier input signals 122c and 124c. Alternatively, a connection across links 140c, 148c and 149c allow the inverted signal 12c to so control the sense amplifier bit lines. As a third alternative, a connection across links 146c grounds all three terminals of the transistor 112c, disabling the cell. The links may be configured as fuses, antifuses, mask-programmed interconnects, or by other means. Like the embodiment shown in FIG. 5, the embodiments shown in FIG. 6 may allow the fifty percent reduction in the number of connecting elements, advantageously reducing the die area necessary to implement the array.

Figure 7:
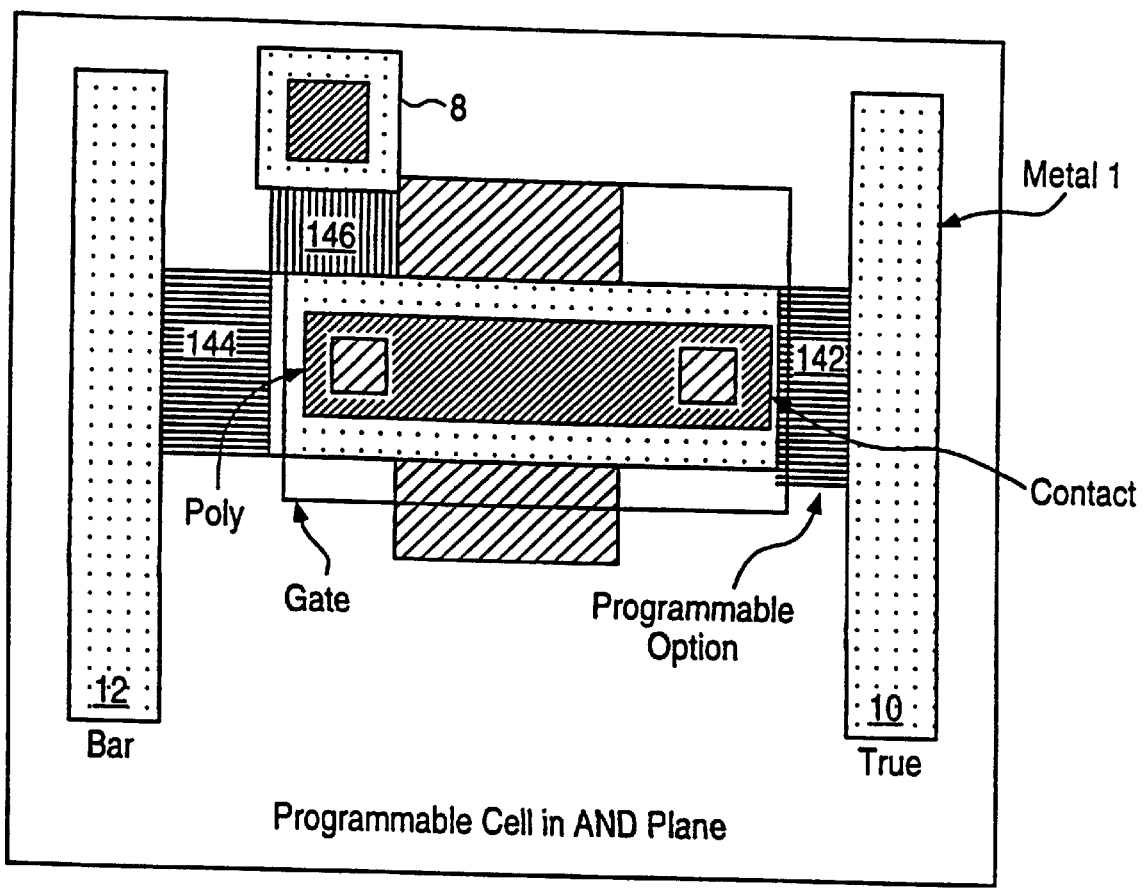
FIG. 7 shows a mask programmed or programmable cell according to one embodiment of the present invention.
Figure 8:
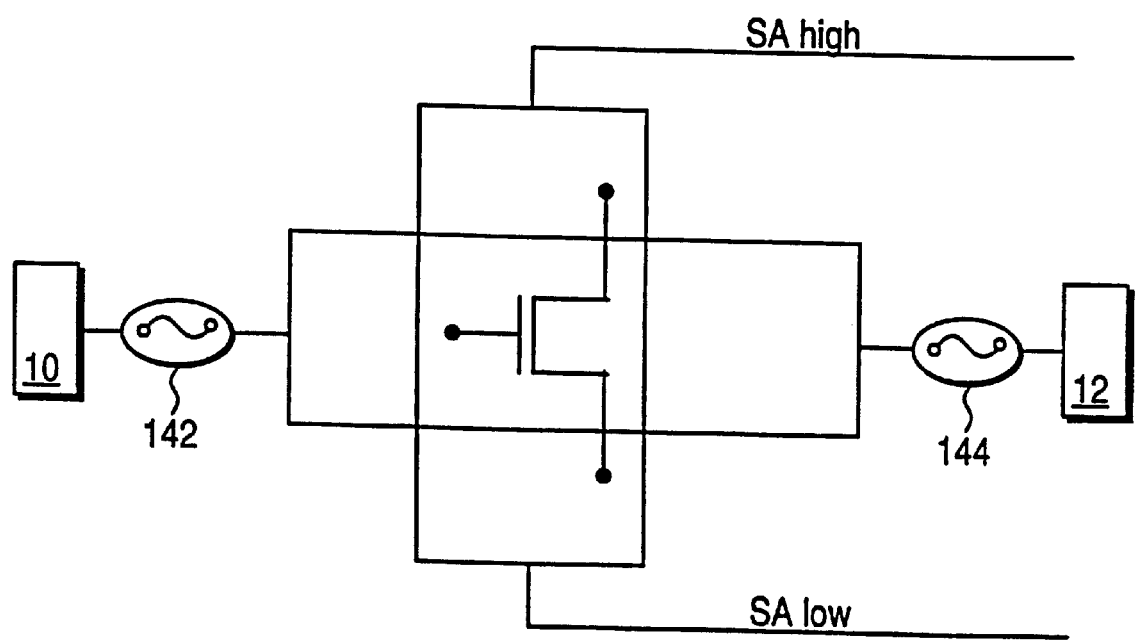
FIG. 8 shows a mask programmed or programmable cell according to the embodiment of FIG. 7.

Referring now to FIGS. 7 and 8, a cell itself according to one embodiment of the present invention is shown in detail. An input signal received by a first conductor 10, an inverted signal received by a second conductor 12, and a ground signal on a third conductor 8 may be independently and selectively connected to a cell. Links that may be configured as fuses, antifuses, mask programmed interconnects, or by other means provide selectable connections between the signals. The links may, in some embodiments, include $E^2$PROM, EPROM, flash memory, or configurable transistors to provide programmability to the cell. It will be recognized that this cell may be used in conjunction with the embodiment shown above. The first conductor 10 and second conductor 12 that may receive first and second signals, respectively, are fabricated on a substrate or a well. Between them, in one embodiment, a programmable cell (i.e., an interconnect) having exactly one transistor is fabricated, the drain and the source terminals of the transistor connected each to a distinct bit line providing a signal to a sense amplifier. The gating terminal of the cell is selectively connectable to the first conductor 10, the second conductor 12, or the ground signal 8 depending on whether fusible links 142 and/or 144 provide a connection. Each of the source and drain terminals of the transistor may, for example, provide a signal to a sense amplifier ("sense amp") contained within the AND plane of an AND-OR programmable array logic device.

The power in the programmable logic device can be increased to achieve the speed. The sense amps can be optimized so that they are faster by burning more power. The other block or device where speed can be obtained in the CPLD is the programmable OR plane. In this block the circuits can be implemented as an array and/or the sense amps can be optimized to burn more power in order to achieve a better speed. For mask programmed options the sense amp in the programmable AND-plane can be optimized to burn lower power by giving up some speed, because other blocks such as a PIM or macrocell may run much faster, to compensate for slower speed blocks in MPLD. The programmable OR-plane can be implemented using full CMOS logic thereby not burning any standby power.

Layout optimization techniques can be applied to further reduce the size for the mask programmable layout. The programmable mask option in this embodiment is assumed to be MM1 (metal 1). In one implementation there is a mask programmable cell for each true and bar inputs to the programmable AND plane which may receive the SAhigh and SAlow signals of the sense amp. In another implementation only one connecting device replaces the two programmable cells. In the new implementation the gate of the connecting device is connected to three inputs through three fuses (F1, F2, F3). The following three conditions must be met for the gate of the connecting device to be programmed, one of when the true input is connected, or the bar input is connected or neither of the inputs are used and the gate is connected to ground. Based on the jedec map only one programmable link gets a first metal layer connection and the other two programmable links are left open.

Figure 9A:
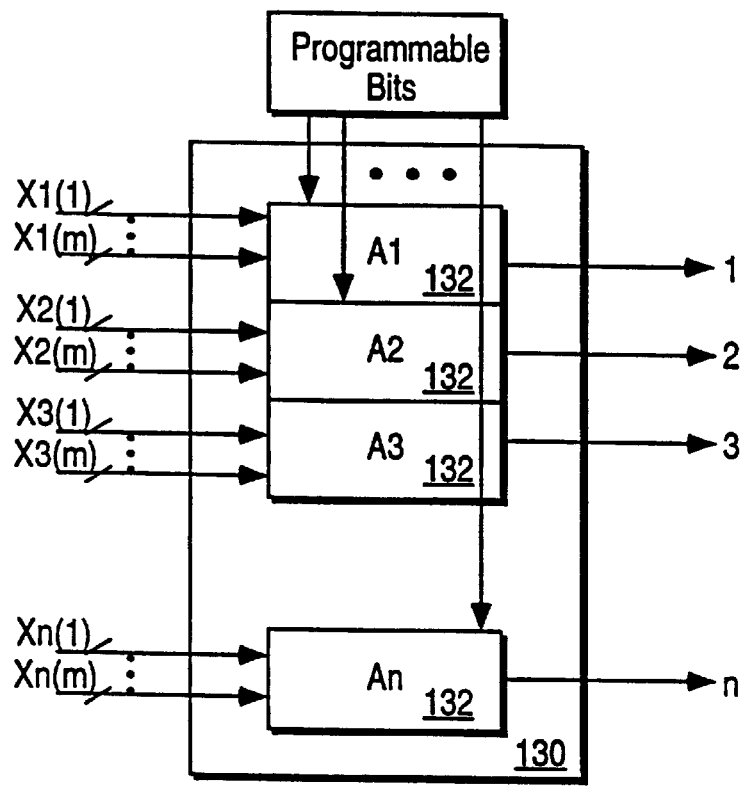
FIGS. 9A and 9B shows a method for programming a programmable interconnect matrix (PIM).
Figure 9B:
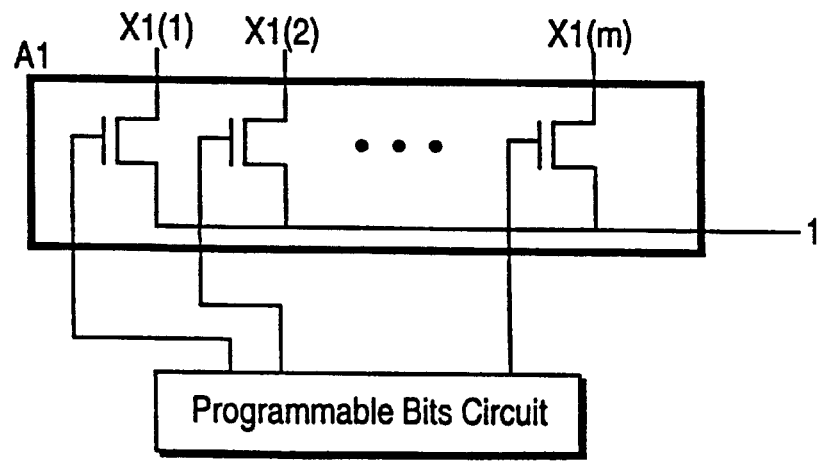

FIGS. 9A and 9B illustrate a common method of programming the PIM as used previously. A plurality of select circuits are used to implement one of M input based on status of programmable configuration bits. The outputs of PIM are connected to inputs 10 of FIG. 1. FIGS. 9A and 9B illustrate a select circuit of the A1 block within a PIM; in a corresponding programmed implementation, the transistors are replaced with mask-programmed interconnects. The select circuits may be implemented as a pass-gate, transmission gates, multiplexer or tristatable inverters, as well as other implementations. Only one input connects to any given output. The inputs to the PIM are a set of X1, X2, . . . , Xn inputs and each of these inputs are m wide. For each set of X(m) inputs there is a output which is a function of programmable config circuit. The output block A1 in the PIM is connected to one of the inputs based on the status of programmable config circuit. In the mask programmable option all the programming circuits and the programmable elements are eliminated and the select circuit are replaced by fuses. Based on the status of the jedec map only one fuse is replaced by metal 1 connection and all the other are left open.

Figure 10B:
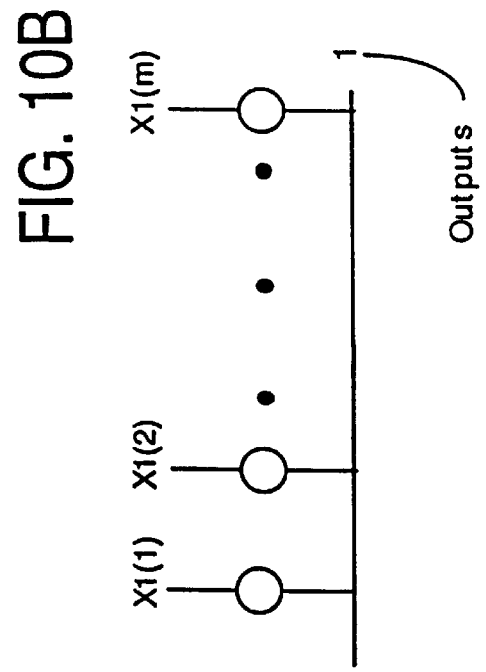
FIGS. 10A and 10B show an improved PIM according to an embodiment of the present invention.
Figure 10A:
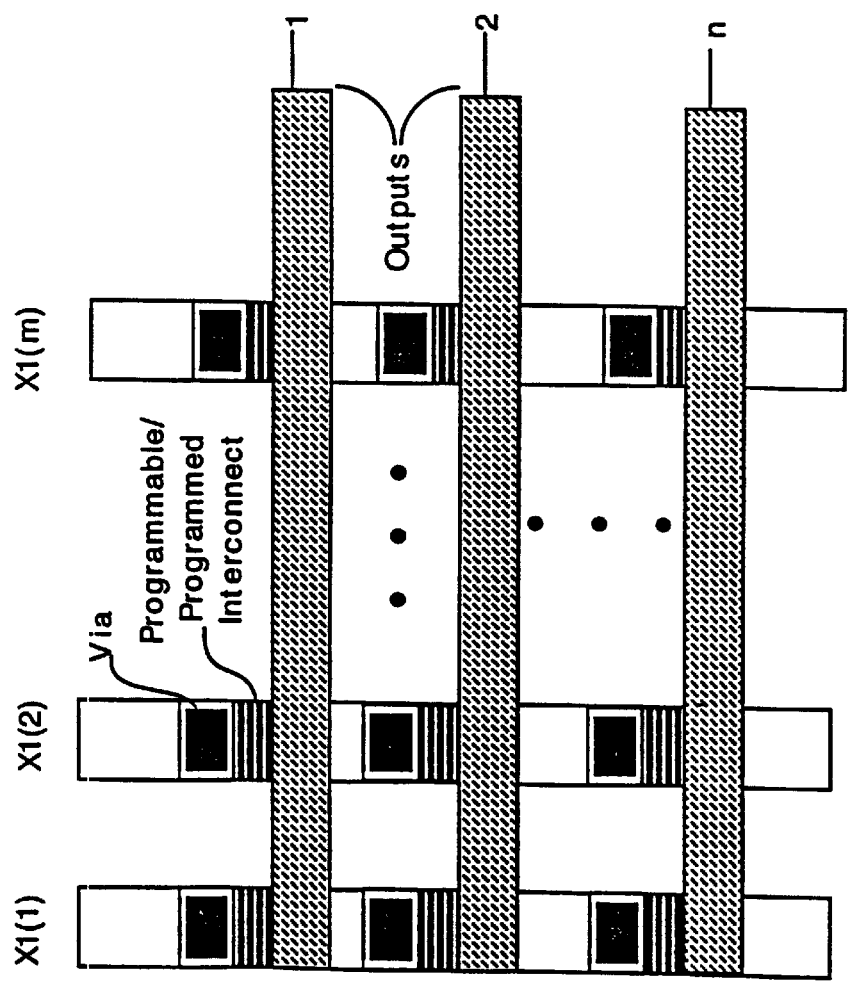

FIGS. 10A and 10B show an improved PIM according to an embodiment of the present invention. Several outputs are each independently and individually interconnectible either to an input or to ground or to Vcc across a via and a mask-programmed interconnect.

At least one of interconnects 142, 144 and 146 is mask-programmed (e.g., put into place [that is, closed or left open] using a mask). The remaining interconnects may comprise a fuse, an antifuse, another programmable element (see, for example, application Ser. Nos. 08/662,056 and 08/662,054, each of which was filed on Jun. 12, 1996, the relevant portions of which are incorporated herein by reference), or a switch (e.g., a transistor), any of which may form an interconnection or an opening in accordance with their conventional uses. Alternatively, the remaining interconnects may be mask-programmed in accordance with the teachings herein. In a preferred embodiment, all of the interconnects to at least one cell are mask-programmed. More preferably, all of the interconnects in a row or block of a PLD comprising a plurality of cells (which may be arranged in a one-, two-, or three-dimensional array) are mask-programmed.

The number of interconnects to a particular gate or terminal of a cell or transistor may equal to the total of the number of input lines, plus one (for the interconnection to ground or other reduced voltage source or signal). When all interconnections are open, a "floating cell" is formed. "Floating cells" do not adversely affect function and/or performance of a PLD, but their presence may lead to increased current and/or power consumption in the PLD.

Figure 11:
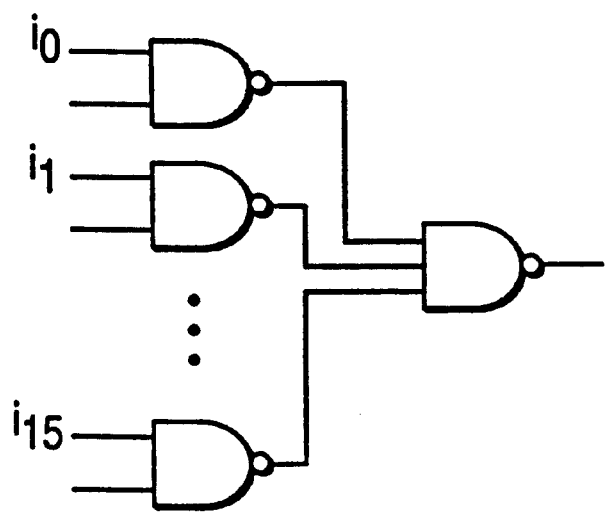
FIG. 11 shows a configurable logic circuit that may be used in a product term.
Figure 12:
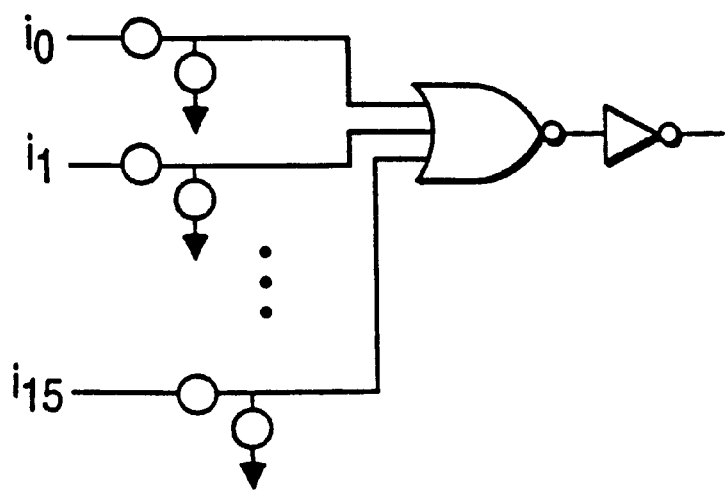
FIG. 12 shows an improved product term logic circuit according to an embodiment of the present invention.

FIGS. 11 and 12 show a 16 bit wide PTM embodiment in a single stage. FIG. 11 shows a plurality of inputs received at a first stage of NAND gates. This first stage in FIG. 11 includes a qualifier gate for each input that uses a configuration bit to pass or disable each input. The first stage requires 64 transistors to implement a 64-input function. A second stage is necessary, requiring another 32 transistors, bringing the total to 96 transistors to implement the PTM of FIG. 11. FIG. 12, however, also receives 16 inputs, the inputs to the first stage selectively and independently fusibly connected to either the inputs or to ground. The configuration in FIG. 12 requires only 34 transistors to implement. Although shown in a NOR configuration, FIG. 12 may also be implemented as a ratioed NOR, programmable AND plane, or any other logic implementation as will be apparent. Thus, the embodiment of the present invention may be implemented in AND-OR or NOR—NOR configurations.

Figure 13:
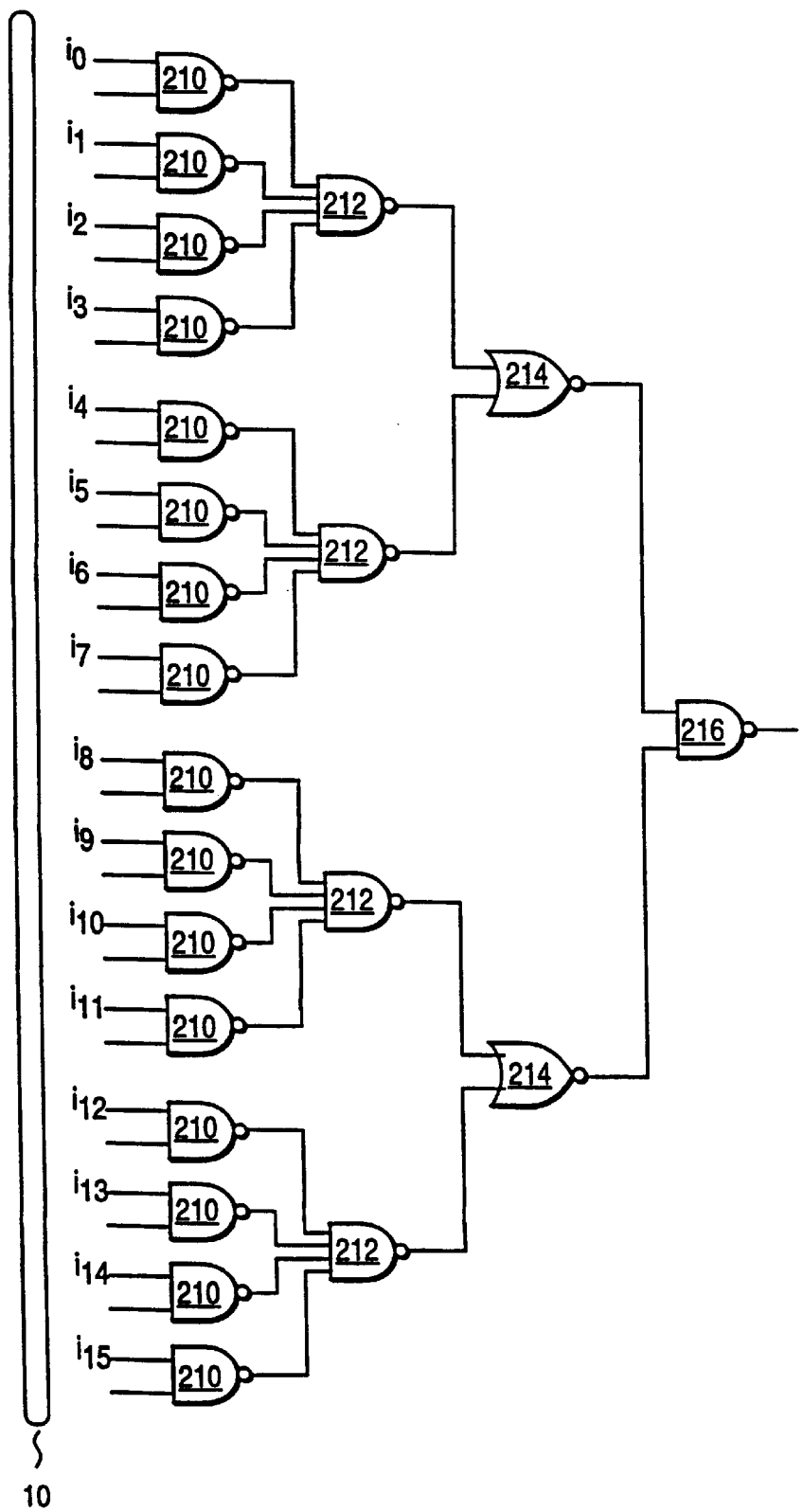
FIG. 13 shows an implementation of a portion of a product term matrix.

FIG. 13 illustrates the previous implementation of a portion of a product term matrix. In the configuration shown in FIG. 13, the first level of logic gates consists of a plurality of NAND gates. The output of the NAND gates 210 is provided to a second stage of NAND gates 212, whose output is in turn provided to a stage of NOR gates 214. The output of the NOR gates 214 is in turn provided to a final stage of NAND gates 216. Although multiple stages of logic may increase the number of transistors and gates needed to implement the circuit, having fewer inputs per gate increases the speed. In the implementation shown in FIG. 13, having 16 input signals in which each logic gate requires 4 transistors, the total number of transistors necessary is 108.

Figure 14:
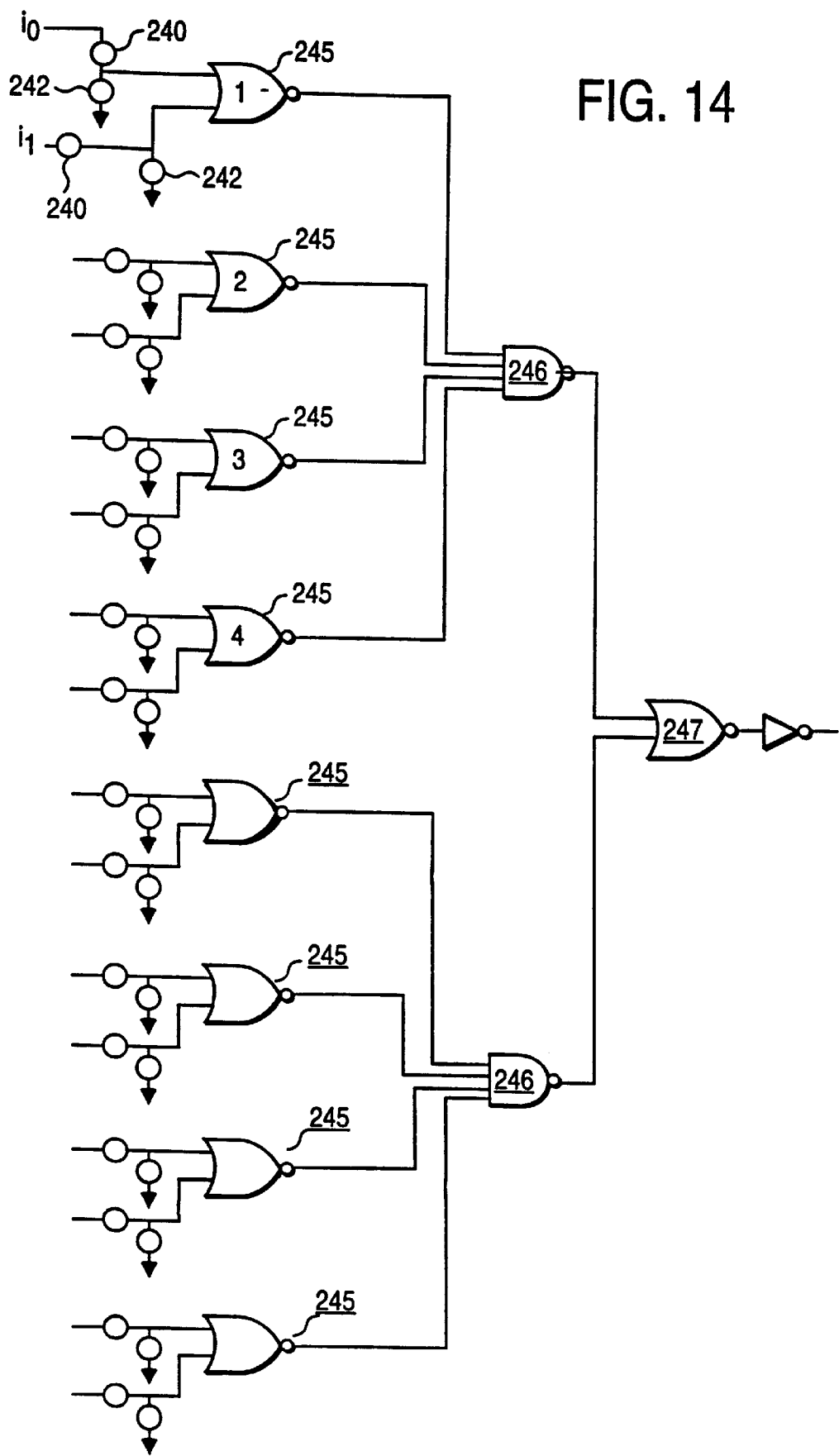
FIG. 14 shows a portion of a product term matrix with a mask-programmable or masked-programmed option according to one embodiment of the present invention.

Referring now to FIG. 14, a product term matrix with a mask programmable option according to one embodiment of the present invention, is shown. Each input signal is coupled by a mask programmed interconnect 240 to an input of a logic gate 245 that is also connected by a second mask programmed interconnect 242 to ground. The logic gates 245 are the first stage in a multistage product term matrix. This advantageously increases the speed while decreasing the number of transistors necessary to implement the PTM. When a signal is selected for use in the PTM, the mask programmed interconnects 240 and 242 are inserted or broken in such manner that the input signal is coupled to the input of the logic gate 245. If a signal is not selected, the input signal to the logic gate 245 associated with the input signal is simply grounded through the mask programmed interconnect 242. In one embodiment, configuring 16 input signals into the PTM requires only three stages of logic gates, a first stage of NOR gates 245, a second stage of NAND gates 246, and a third stage that may be configured as an OR gate 247. The PTM may alternatively be implemented as a ratio NOR, having mask programmable interconnects to implement a logic function, like the array previously described in reference to the sense amplifier. Applying greater power will allow faster speeds.

The PTM implements an OR-plane (in an AND/OR implementation) or second NOR-plane (in a NOR/NOR implementation) of a programmable or programmed logic device. The PTM receives the sense amp outputs corresponding to the AND-plane (in an AND/OR implementation) or the first NOR-plane (in a NOR/NOR implementation) and couples the sense amp outputs to the PTM logic gates.

As is apparent from a comparison of the logic circuits in FIG. 13 (configurable) and FIG. 14 (mask-programmed), the number of FETs needed to implement the circuit may be reduced by as much as 50%. This results in many advantages, including a significant reduction in die space, and may also produce power and speed advantages.

Figure 15:
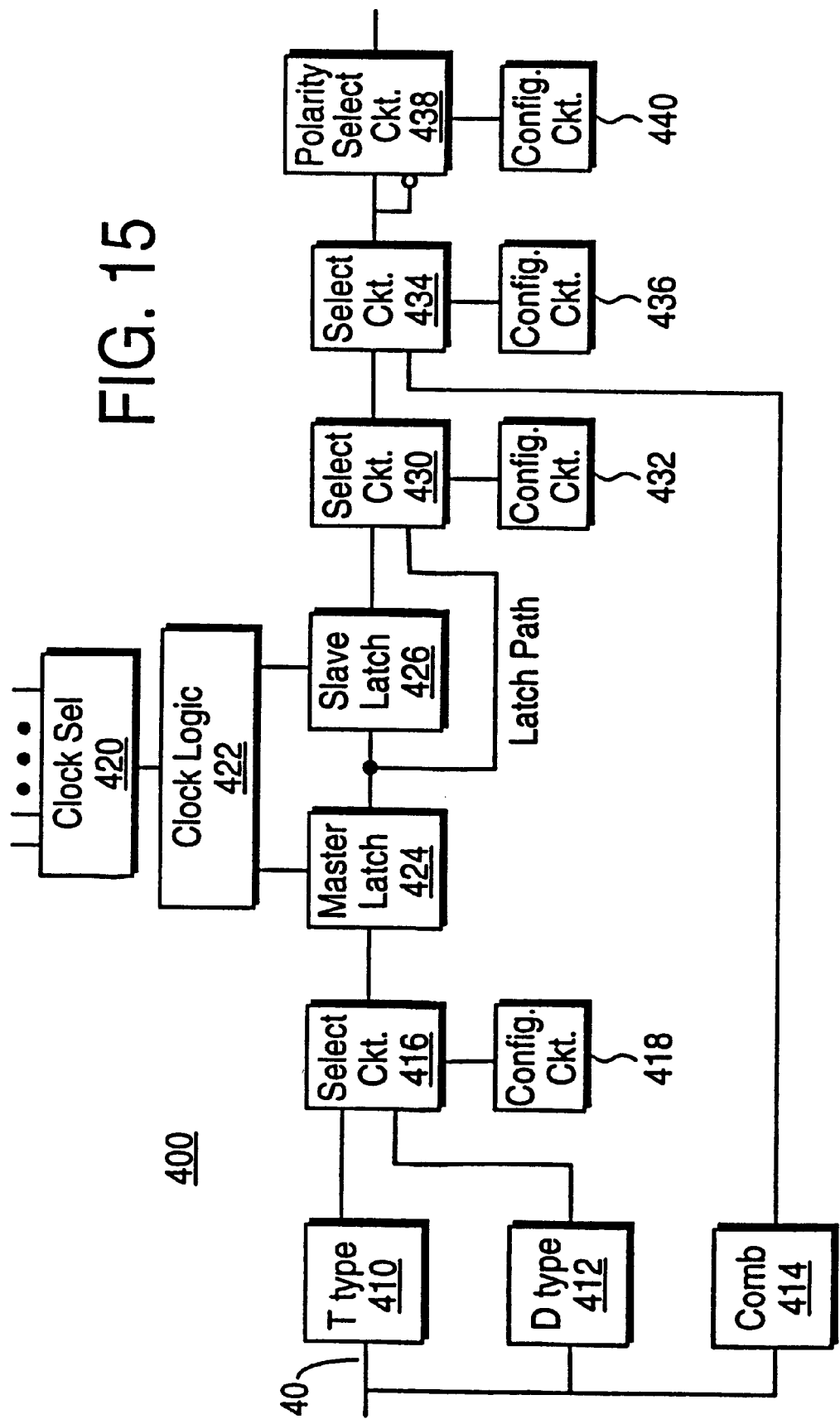
FIG. 15 shows a conventional macrocell.

Referring now to FIG. 15, a macro-cell according to the previous embodiment is shown. An input signal 40 is received at the input of three devices: a T-type flip flop 410, a D-type flip flop 412, and a combinational logic circuit 414. The output of the T-type flip flop 410 and the D-type flip flop 412 are provided to a select circuit 416, configured by a configuration circuit 418, that provides a signal to a master latch 424. A slave latch 426 and a select circuit 430 both receive the output of the master latch 424, the select circuit 430 also receiving a signal directly from the slave latch 426. A configuration circuit 432 configures the select circuit 430. A final select circuit 434 receives signals both from the select circuit 430 and the combinational circuit 414 and provides an output to a polarity select circuit 438 according to the configuration circuit 440. All four select circuits including the polarity select circuit are configured by configuration circuits 418, 432, 436, and 440, respectively. All four configuration circuits must be configured before the macro-cell can be used, and yet do not change during the use of the macro-cell. Therefore, the configuration circuits include circuitry to configure the select circuits and polarity select circuits according to macro-cell designs that are not used. These occupy additional die area.

Figure 16:
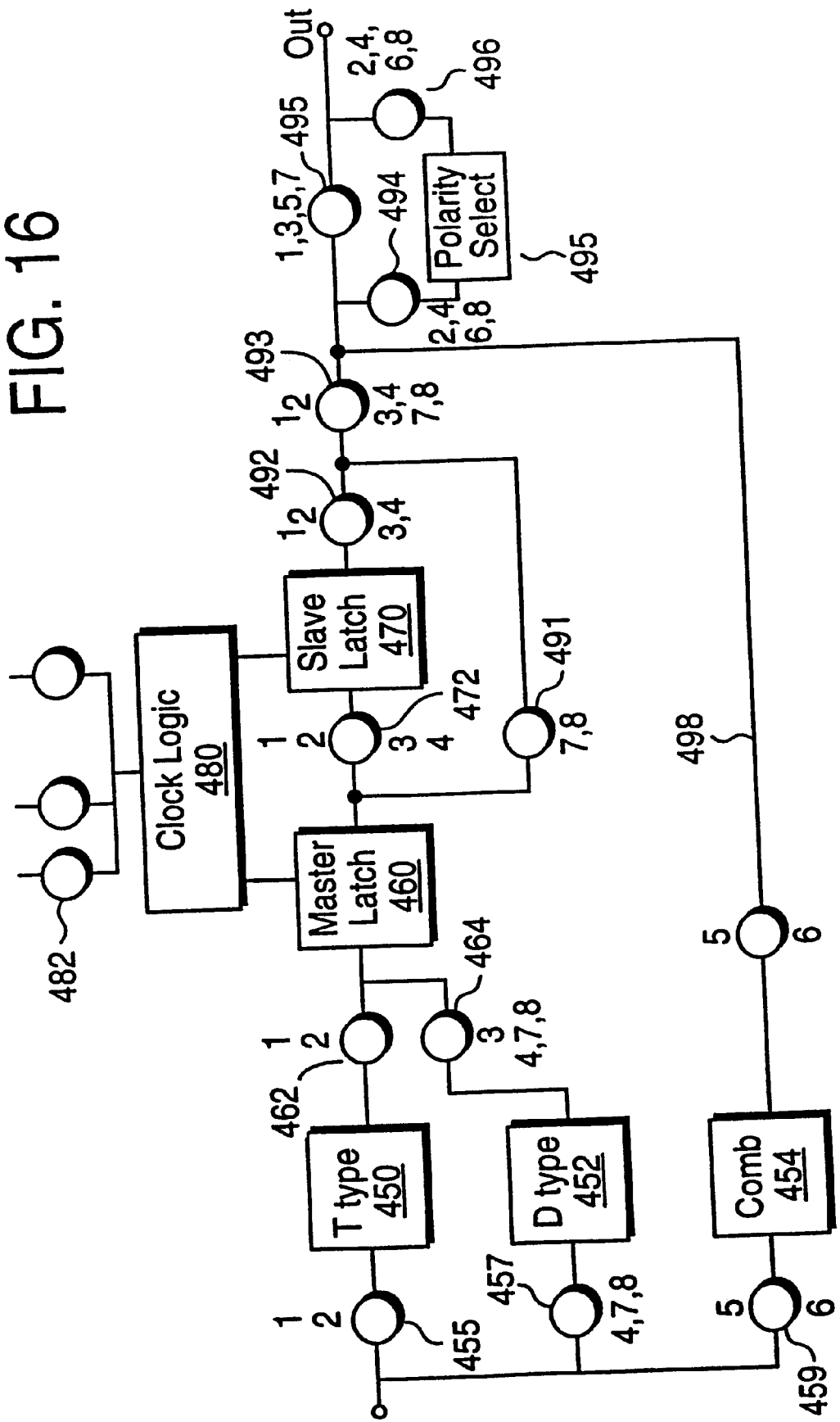
FIG. 16 shows a mask programmed or mask-programmable macrocell according to one embodiment of the present invention.

Referring now to FIG. 16, a mask-programmed macro-cell according to one embodiment of the present invention is shown. An input signal is coupled to a T-type select circuit, a D-type select circuit, and a combinational logic circuit by three links. These links may be implemented by any of the above-described technologies, including fuses, antifuses, or mask-programmed interconnects, or otherwise. Different types of links may be used in the same macrocell, for example some links being implemented as mask-programmable interconnects, fuses or antifuses. The input is connected to a T-type select circuit 450 by a link 455 that provides a connection when the macro-cell is in a first or second state. The type select circuit 452 is coupled to the input by a link 457 that provides a connection when the macro-cell is in a third, fourth, seventh, or eighth state. The combinational logic circuit 454 is coupled to receive the input signal by a link 459 that provides a connection when the macro-cell is in a fifth or sixth state. A master latch 460 is coupled to receive signals from the select circuits by links 462 and 464, link 462 providing a connection between the D-type select circuit 452 and the master latch 460 when the link is in the first or second state. Link 464 provides a connection between the D-type select circuit 452 and the master latch 460 when the macro-cell is in a third, fourth, seventh, or eighth state. A slave latch 470 is coupled to receive the signal latched by the master latch 460 when a link coupling the slave latch 470 to the master latch 460 is in the first or second state. The output of the macro-cell is coupled by a network of links to receive either the output of the slave latch 470, the output of the master latch 460, or the output of the combinational circuit 454 according to the state of the macro-cell and the consequent state of a link network.

Continuing to refer to FIG. 16, the macro-cell according to the illustrated embodiment of the present invention, has eight separate states. This configuration advantageously avoids the need to supply the macro-cell with select circuits, since the select circuit function is provided by masking a number of links. No clock select cells are required, either. Speed is increased, because the load is far less using the mask-programmed embodiment of the present invention than is used in the prior art configuration shown in FIG. 16. As stated above, links may be independently configured as either fuses or antifuses, or otherwise. Fusible links or antifusible links may serve to provide the interconnections and links.

According to the embodiment shown in FIG. 16, when the macro-cell is in a first state, the input signal is received by the T-type select circuit, latched by both the master latch and the slave latch, and then provided directly to the output. When the macro-cell is in a second state, the input is again received by the T-type select circuit 450 and provided to the master latch 460 and thereafter to the slave latch 470, but is inverted thereafter before being provided to the output. When the macro-cell is in a third or fourth state, the input signal is coupled to the D-type select circuit 452, the output of which is provided to the master latch 460, whose output is provided to a slave latch 470. In the third state, the slave latch output is provided directly to the macro-cell output, while in the fourth state the slave latch output is inverted before being provided to the macro-cell output. In the fifth and sixth states, the macro-cell receives the input signal and provides that input signal directly to a combinational logic circuit 454, providing the combinational logic circuit output directly to the macro-cell output when the macro-cell is in the fifth state and inverting the combinational logic circuit output before providing it to the macro-cell output in the sixth state. In the seventh and eighth states, the macro-cell uses the D-type 452 and master latch 460 as in the third and fourth states, but bypasses the slave latch 470.

Figure 17:
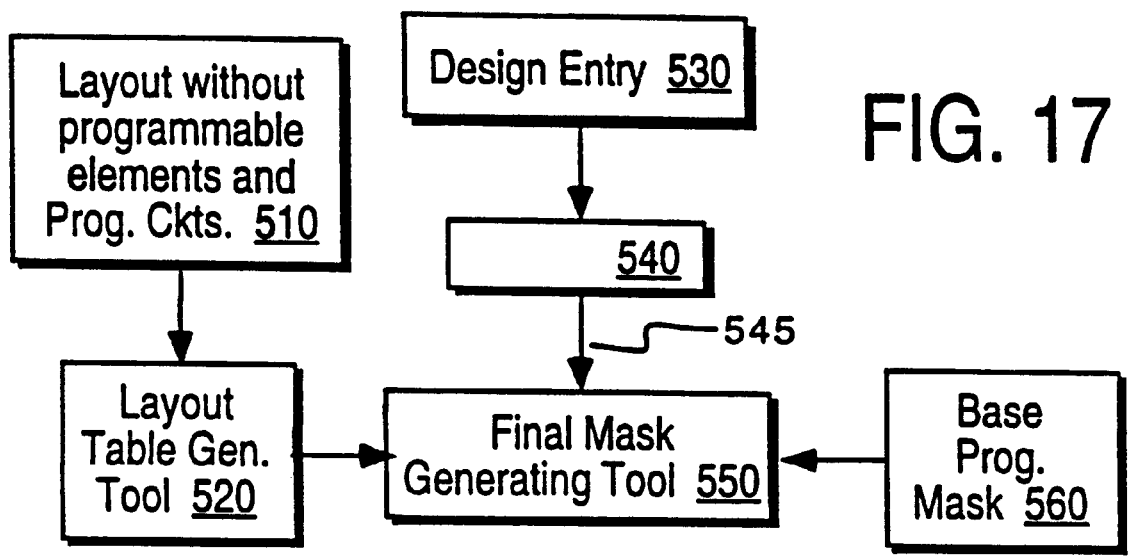
FIG. 17 shows a method of producing mask programmed device from a field programmable device according to one embodiment of the present invention.

Referring now to FIG. 17, one process or method of using the present invention in a one embodiment is shown.

The new method has two fundamental implementation steps. The first step is related to design and the second step involves development of methodology for the implementation of this concept and software tool required for it.

In the first step a parallel layout is generated for the mask programmable PLDs/CPLDs/FGPAs along with the full custom design. From the mask programmable layout all the programmable elements are removed. All these programmable cells are replaced by mask programmable options. In the second step, all the programming circuits are removed from the PLDs/CPLDs/FGPAs. This can be done by generating an interconnect layer and placing it at various locations in the layout to implement logic functions corresponding to the jedec map, LOF file, or any other such file.

Referring to the embodiment shown in FIG. 17, the steps of the method are now explained in greater detail. Initially, a base programmable mask is generated 560. The base programmable mask includes conductors at predetermined locations, independent of the particular logic function to be implemented. As shown in FIGS. 7 and 8, these conductors include the true input on a first conductor 10, the inverted input on a second conductor 12, and the ground signal on conductor 8. Referring again to FIG. 17, the base layer also places conductors corresponding to the outputs of either the first or second plane in the vicinity of input conductors, according to the simplified and cheaper process. Thus, the base programmable mask includes conductors corresponding to the inputs, and also conductors corresponding to the outputs, of one of the logic planes.

Independent of base programmable mask fabrication, a user determines a logic function to be implemented in a final mask-programmed device. Once the logic function is determined, an interconnect map may be derived using any of a number of software tools. The interconnect map, which may be implemented as a jedec map, an LOF file, or otherwise, is used in programming the device according to the logic function. In many applications, the logic function or the interconnect map may be provided by a customer. One embodiment of the present invention provides mask programmable logic devices (MPLDs) that may be efficiently, inexpensively and quickly produced in accordance with the jedec map, LOF file, or other programming source. In various embodiments, the mask programmed device to be generated may implement a PLD, CPLD, FPGA, or other programmed device. In some embodiments, the interconnect map, which is implemented as a jedec map, LOF file, or other similar file indicating the location of programmable elements, is generated by a computer program or system 540 that also reduces the logic function to be implemented. In particular, a computer system running a software compiler or other design tool is supplied both with information regarding a programmable logic device and also with a logic function to be implemented thereon 530, the computer system providing as an output a jedec map or LOF file 545. Jedec maps and LOF files provide programming information to implement the required logic function. It is irrelevant, however, whether a LOF file or a jedec map, or some other mapping provides the interconnect mask for the device.

In one embodiment, such a jedec map includes bit pairs corresponding to each occurrence of a given input to each cell. The location of a bit pair within the jedec map indicates which input and which output to the plane may be connected through a given cell. Each bit pair in the jedec table corresponds to a particular cell within a given plane in the logic circuit. For example, a "10" may indicate that a given input represented by the column in the jedec map should be connected to the true input to the cell represented by the row in the jedec map. "01" may indicate connection to the bar input, while "00" or "11" may represent grounding, disabling, or don't-cares, depending on the file protocol. Compilers that produce such maps generally access a data file containing parameters associated with a particular PLD/CPLD/FPGA on which the map may be implemented. Compilers that receive logic functions as Boolean functions, as truth tables, and as Karnaugh maps, and (for registered logic) as state tables, are known in the art. Depending on the implementation protocol, for PLDs/CPLDs or FPGAs jedec maps or LOF files may then represent locations for fusing or for antifusing. The jedec map or LOF file completely describes the logic function to be implemented on a PLD, FPLD, or FPGA described in the data file. As further shown in the method of the present invention shown in FIG. 17, a user determines a jedec map for a FPLD or a LOF file for FPGA using a first system 540, compiling a combinational or sequential function into a jedec map or LOF file. The first system 540 produces a jedec map corresponding to a particular function and FPLD, the FPLD containing a PIM (Programmable Interconnect Matrix, implementing an AND-gate array or the first NOR-array a NOR—NOR device) and/or a PTM (Product Term Matrix, implementing an OR-gate array or the second NOR-array of NOR—NOR device). Alternately, the FPGA's implement programmable gate array logic blocks or routing blocks for implementing logic functions.

Based upon a layout without programmable elements or circuits 510, the location of each conductor is stored in a layout table 520, which stores and maps the location of inputs to the plane into the location of outputs, so that subsequent interconnection is facilitated.

Continuing to refer to FIG. 17, the appropriate file 545 is then provided to a separate system 550 that generates a mask according to the jedec map or LOF file. As a final step, the layout table and the file representing the logic function are provided to a final mask generating tool that computes the location of interconnections, based on the layout table, that implement the logic function represented in the file on the base layout. The final mask generating tool then provides interconnections 142, 144 or 146, where appropriate. Such interconnections may be accomplished by dropping metal antifuses, dropping vias (for FPGAs), or breaking fuses, or by other methods. Thus, the logic connections indicated in the jedec map, LOF file or other file may be implemented as physical connections located by reference to the layout table, on the base mask. Links within the programmable array logic device are either connected or open according to the mask itself. Finally, the mask programmed device is returned to the user or customer. According to this process, therefore, the user or customer may continue using whatever software tool or compiler that user is accustomed to, to generate the jedec map or LOF file, while a separate function practicing the present invention can provide smaller, denser, and cheaper mask programmable devices that serve as custom devices, though may be easily configured.

The apparatus and method of the present invention may be embodied in other specific forms without departing from its spirit and essential characteristics. The described embodiments are to be considered in all respects only as illustrative and not restrictive. The scope of the invention is, therefore, indicated by the appended claims rather than by the foregoing description.

We claim:

1. A mask-programmed product term matrix, comprising:
   a plurality of a logic gates each having (i) a plurality of input conductors each independently configured by a mask-programmed interconnect to receive either an input signal or a predetermined level signal, and (ii) an output conductor coupled to provide an output signal.

2. A mask-programmed product term matrix (PTM) as set forth in claim 1, further comprising a combinatorial circuit, wherein at least one of said logic gates and said combinatorial logic circuit implement a logic function.

3. The mask-programmed product term matrix of claim 2 wherein the logic gates are individually either OR gates or NOR gates, such that the inputs of at least one logic gate is coupled to at least one cell via a mask-programmed interconnect.

4. A mask-programmed product term matrix (PTM) as set forth in claim 2, the product term matrix receiving PTM inputs and providing one or more PTM outputs, the product term matrix comprising:
   a plurality of PTM blocks, each PTM block coupled to receive a predetermined subset of the PTM inputs, each block containing a plurality of programmed cells, each programmed cell having:
   a cell input;
   a conductor having a region, said conductor providing an input signal to said cell input if said region is closed;
   a mask-programmed interconnect for selectively closing said region such that said cell input is coupled to said input signal through said region.

5. A mask-programmed product term matrix (PTM) as set forth in claim 2, the product term matrix receiving said plurality of inputs and providing a plurality of outputs, such that each output is a logical function of a subset of input signals, at least one of the outputs being coupled to at least one input of a macrocell via a mask-programmed interconnect.

6. A mask-programmed cell, comprising:
   an input;
   an output; and
   a transistor, the transistor having a first terminal and a second terminal; wherein:
   said cell is configured in a first of three possible states when (a) said cell input is coupled to said first terminal via a first of two mask-programmed interconnects, and (b) said second terminal is coupled to said output;
   said cell is configured in a second of said three possible states when (a) a complement of said cell input is coupled to said first terminal via a second of said two mask-programmed interconnects, and (b) said second terminal is coupled to said output; and
   said cell is configured in a third of said three possible states when either of said second terminal or said output is coupled to a predetermined level signal.

7. The mask-programmed cell of claim 6, wherein said cell is configured in said third possible state, and said second terminal is coupled to said predetermined level signal via a closeable interconnect.

8. The mask-programmed cell of claim 6, wherein:
   when said cell input is coupled to said first terminal, said complement of said cell input is not coupled to said first terminal; and
   when said complement of said cell input is coupled to said first terminal, said cell input is not coupled to said first terminal.

9. The mask-programmed cell of claim 6, wherein said cell further comprises a second output, a first closeable interconnect between said predetermined level signal and said first output, and a second closeable interconnect between said predetermined level signal and said second output.

10. The mask-programmed cell of claim 6, wherein said first terminal is a gate terminal, and said second terminal is a non-gate terminal.

11. The mask-programmed plane of claim 3, wherein said first terminal is a gate terminal, and said second terminal is a non-gate terminal.

12. The mask programmed logic device of claim 6, wherein said mask-programmed interconnect represents a logic function.

13. A mask-programmed logic device, comprising a plurality of the mask-programmed cells of claim 6.

14. A mask-programmed plane comprising a set of mask-programmed cells as set forth in claim 6, the mask-programmed plane further comprising:
   a bit line and a sense amplifier coupled to the bit line, said sense amplifier sensing the bit line, such that the set of cells provides a first bit line input signal on the bit line when a region of at least one cell in the set is closed.

15. The mask-programmed plane of claim 14, wherein the mask programmed plane is an AND-array, implementing an AND logic function between inputs and the outputs of the mask-programmed plane.

16. The mask-programed plane of claim 14, wherein the mask-programmed plane is a NOR-array, implementing a NOR logic function between the inputs and the outputs of the mask-programmed plane.

17. The mask-programmed plane as set forth in claim 14, wherein the mask-programmed plane is a NAND array which implements a NAND logic function.

18. The mask-programmed plane as set forth in claim 11, wherein the mask-programmed plane is an AND-array, implementing an AND logic function between inputs and the outputs of the mask-programmed plane.

19. The mask-programmable plane of claim 11, wherein the mask-programmed plane is a NOR-array, implementing a NOR logic function between the inputs and the outputs of the mask-programmed plane.

20. The mask programmed logic device (MPLD) of claim 13, further comprising at least one closeable interconnect between at least one of (i) a second input and said first terminal, (ii) said second terminal and said output, and (iii) said second terminal and said predetermined level signal, wherein each of said at least one of said closeable interconnects is independently a member selected from the group consisting of a fuse, an antifuse, and a mask programmed interconnect.

21. The mask programmed interconnect plane of claim 11, wherein the cell further comprises a second non-gate terminal, the plane further comprises a second bit line coupled to said sense amplifier, and the non-gate terminals are separately coupled to the individual bit lines and to the predetermined level signal via mask programmed interconnects.

* * * * *